(12) United States Patent
Smith

(10) Patent No.: US 12,270,707 B2
(45) Date of Patent: Apr. 8, 2025

(54) PULSED SPECTROPOLARIMETER

(71) Applicant: Roger Smith, Lake Forest, CA (US)

(72) Inventor: Roger Smith, Lake Forest, CA (US)

( * ) Notice: Subject to any disclaimer, the term of this patent is extended or adjusted under 35 U.S.C. 154(b) by 162 days.

(21) Appl. No.: 17/979,395

(22) Filed: Nov. 2, 2022

(65) Prior Publication Data
US 2024/0142308 A1    May 2, 2024

(51) Int. Cl.
*G01J 4/04* (2006.01)
*G01J 3/02* (2006.01)
*G01J 3/28* (2006.01)

(52) U.S. Cl.
CPC ............... *G01J 4/04* (2013.01); *G01J 3/0224* (2013.01); *G01J 3/2823* (2013.01)

(58) Field of Classification Search
CPC ........... G01J 3/0224; G01J 3/2823; G01J 4/04
See application file for complete search history.

(56) References Cited

U.S. PATENT DOCUMENTS

| | | | | |
|---|---|---|---|---|
| 7,599,062 B2 * | 10/2009 | Smith | ................. | G21B 1/23 |
| | | | | 356/367 |
| 2013/0158961 A1 * | 6/2013 | Imazawa | ................ | G01K 13/00 |
| | | | | 703/2 |
| 2017/0363472 A1 * | 12/2017 | Abdulhalim | .......... | G02F 1/1393 |

OTHER PUBLICATIONS

Webpage—Princeton Collaborative Low Temperature Plasma Research Facility (Year: 2021).*

* cited by examiner

*Primary Examiner* — Hina F Ayub

(57) ABSTRACT

This disclosure is directed to pulsed spectropolarimeters for conducting remote, non-perturbative measurements of the local magnetic field, density and temperature fields of a magnetized plasma medium. In one aspect, a pulsed spectropolarimeter includes a light source emitting a polarized light pulse having sufficiently narrow spatial extent at a prescribed wavelength and a light gathering optical system including a light gathering optic having an optic axis directed toward the medium and positioned to collect and collimate a predetermined solid angle of the scattered emission by the pulse in the backward direction, toward the source, while preserving the polarization state of the emission. A proportion of the emission is redirected to a spectrometer detector to determine the spectral distribution of the emission. A second optical collection and spectrometer system collects emission other than backscatter localized to the intersection of the pulse trajectory and the focus of this collection system.

5 Claims, 5 Drawing Sheets

PULSED SPECTROPOLARIMETER

TECHNICAL FIELD

This disclosure is directed to devices and methods for remote non-perturbative and localized measurements of contemporaneous distributions of a magnetic field, plasma density and plasma electron and ion temperatures internal to a magnetized plasma medium.

BACKGROUND

The pulsed polarimeter, as described in U.S. Pat. No. 7,599,062 B2, uses a LIDAR technique to measure the state of polarization and intensity of the scattered light emitted by induced scattering from a polarized light pulse propagating in a magnetized plasma medium. The scattering process is known as Thomson scattering. A measurement of the state of polarization and intensity of the backscattered emission from the light pulse can be used to determine the local magnetic field and density distributions along the path of the pulse in the magnetized plasma medium. The relation between time of the measurement t, and the location of the measurement at location s, is given by time-of-flight, s=ct where c is the velocity of light, 300 million meters per second.

Pulsed polarimetry uniquely addressed the need of the magnetic fusion energy (MFE) community to be able to directly measure the magnetic field at any location in a fusion relevant magnetized plasma. In such plasmas, the plasma's ion temperature reaches 100-200 million ° K. the plasma's electron temperature is similar but generally lower and the plasma's density is typically $0.5\text{-}1.0\times10^{20}$ m$^{-3}$. The pressure of such a high temperature, low density, tenuous gas is around 10 atmospheres which is the engineering limit for the vacuum vessel. The plasma is confined away from the material walls of the confinement chamber using magnetic fields of about 1-3 Tesla strength. The success of sustaining a burning plasma using magnetic confinement will rely on how well the internal distributions of density, temperature and field can be measured and controlled.

So far, pulsed polarimetry has not played a role in MFE because the laser source appropriate for a pulsed polarimeter was demanding. The pulsed laser source for the pulsed polarimeter lases at a wavelength in the far-infrared region of the optical spectrum, the 100-300 micron range (1-3 THz in frequency), have an ultrashort pulse length of one nanosecond or less, and a pulse energy greater than 50 milli-Joules. The technology to achieve this has been lacking and only recently have these laser source parameters been met and now the prospects of deploying a pulsed polarimeter on a fusion device have become become favorable. Laser technology has finally caught up with the pulsed polarimeter concept.

In the meantime, since the pulsed polarimeter patent was published, several issues in plasma diagnostic measurements have come to light that affect the accuracy of the magnetic field measurement for plasmas achieving the high densities and temperatures of relevance to fusion energy.

First there is the problem of the magnetized plasma having two, possibly interacting, magnetic activities that affect the state of polarization of the pulse and therefore the state of polarization of the scattered emission from the pulse. The Faraday effect is by far the dominate effect, producing a circular birefringence, or a rotation of the pulse's polarization azimuth, $\alpha$. The pulsed polarimeter measures the progressive Faraday rotation with distance or time as the light pulse propagates through the plasma. The progressive Faraday rotation, $\alpha$, along the path, is given by $$\alpha(s)=2\times2.63\times10^{-13}\lambda_o^2\int_0^s n_e B_\parallel(s')ds' \qquad \text{Eq 1}$$

where $B_\parallel(s)$ is the local component of the magnetic field aligned with the trajectory of the pulse at sightline position s, $n_e(s)$ is the electron density of the medium at sightline position s, and $\lambda_0$ is the wavelength of the pulse. MKS units are used, with density given in units of m$^{-3}$, magnetic field in Tesla and angle, $\alpha$, in radians. The local field, $B_\parallel(s)$, is given by the rate of change of $\alpha$ with distance s as follows $$B_\parallel(s) = 1.9x10^{12} \frac{1}{\lambda_0^2 n_e(s)} \frac{d\alpha}{ds} \qquad \text{Eq 2}$$

A measurement of the medium's electron density, $n_e(s)$, is used to determine $B_\parallel(s)$, which is a field that is directly proportional to the intensity, I(s), measured by the pulsed polarimeter independently of the Faraday rotation angle.

The second magneto-optical activity is the Cotton Mouton (CM) effect, producing a linear birefringence, more commonly known as a retardance, the state of polarization of the light pulse becomes elliptically polarized, as does the state of polarization of the scattered emission induced by the light pulse. The angle describing ellipticity is denoted by $\chi$. Along the path of the light pulse, $\chi(s)$ is given by $$\chi(s)=2\times2.46\times10^{-11}\lambda_o^3\int_0^s n_e B_\perp^2(s')ds' \qquad \text{Eq 3}$$

where $B_\perp(s)$ is the local component of the magnetic field that is perpendicular to the trajectory of the path.

The CM effect exhibits a strong dependence on the square of the component of the local magnetic field perpendicular to the pulse's trajectory, $B_\perp(s)$, but has a linear dependence on the local electron density, $n_e(s)$. The laser wavelength cubed dependence makes the CM effect weak. However, for tokamak devices with strong toroidal magnetic fields near the inner wall reaching 5 Tesla or higher, the CM effect can become strong and an important issue. Since the CM effect allows the physical parameter, $B_\perp(s)$ to be measured, a longer laser wavelength may be chosen to make this effect stronger and measurable. Then the Faraday effect and the Cotton Mouton effect can become comparable.

The local field, $B_\perp(s)$, is given by $$B_\perp(s) = 1.4x10^5 \sqrt{\frac{1}{\lambda_0^2 n_e(s)} \frac{d\chi}{ds}} \qquad \text{Eq 4}$$

When the two angles are sizeable, the Faraday effect and CM effect can no longer be clearly distinguished, one says that the effects are entangled. See "Interaction between Faraday rotation and Cotton-Mouton effects in polarimetry modeling for NSTX", J. Zhang, et al. (2010) *Rev. Sci. Insir.* 81, 10D519. A large ellipticity can produce a state of polarization which appears to be a state of polarization produced solely by a Faraday rotation from a magnetic field aligned with the pulse trajectory but wasn't. Only by following the state of polarization history, measuring the distribution given by a pulsed polarimeter, can the contributions of $B_\parallel$ and $B_\perp$ along trajectory become known.

A conventional polarimeter diagnostic measures the line integrated Faraday rotation, $\alpha$, and the ellipticity, $\chi$, across the plasma. The distribution of the state of polarization along the trajectory through the plasma is hidden by the integral. Therefore, any number of distributions $B_\parallel(s)$ and $B_\perp(s)$ could be invoked to produce the measured state of polarization of the conventional polarimeter. Only by following the history of the state of polarization, $\alpha(s)$ and $\chi(s)$, along the sightline can the distributions of $B_\|(s)$ and $B_\perp(s)$ be ascertained. A Pulsed polarimeter with a full Stokes vector polarimeter that measures both $\alpha(s)$ and $\chi(s)$ along the path of the pulse allows the two effects to be untangled and a two dimensions of a magnetic field vector $(B_\|(s), B_\perp(s))$ to be separately measured, which is extremely powerful. Pulsed polarimetry solves this diagnostic problem if the complete state of polarization $(\alpha(s), \chi(s))$ is measured, i.e. a Stokes vector polarimeter is used. Only a distributed measurement of both effects can distinguish and measure and separate the contributions from the two magneto-optic activities.

The second issue with plasma diagnostics that is becoming important as MFE program builds plasma devices that reach plasma parameters that are sufficient to generate fusion energy, is that for temperatures above 10 million ° K, the two equations. Eq 2 and Eq 4 have to be modified for temperature dependencies. See "Electron kinetic effects on interferometry and polarimetry in high temperature fusion plasmas". V. V. Mirnov, et al, (2013) Nucl. Fusion, 53, 113005. The plasma's electron temperature, $T_e(s)$, along the trajectory can be used to interpret the measurements of $\alpha(s)$ and $\chi(s)$ in terms of the desired physical variables of $B_\|(s)$ and $B_\perp(s)$. The measurements can be off by a significant amount if not corrected and the corrections require that the electron temperature be known along the light pulse's trajectory. These two effects, the presence of a significant Cotton Mouton effect that corrupts the interpretation of $\alpha(s)$ as a direct measurement of $B_\|(s)$ and the electron temperature dependence of the equations that govern the interpretation of the measured polarimetric angles, $\alpha(s)$ and $\chi(s)$, limits the efficacy of the pulsed polarimetry technique on fusion relevant magnetized plasmas.

DETAILED DESCRIPTION

Figure 1A:
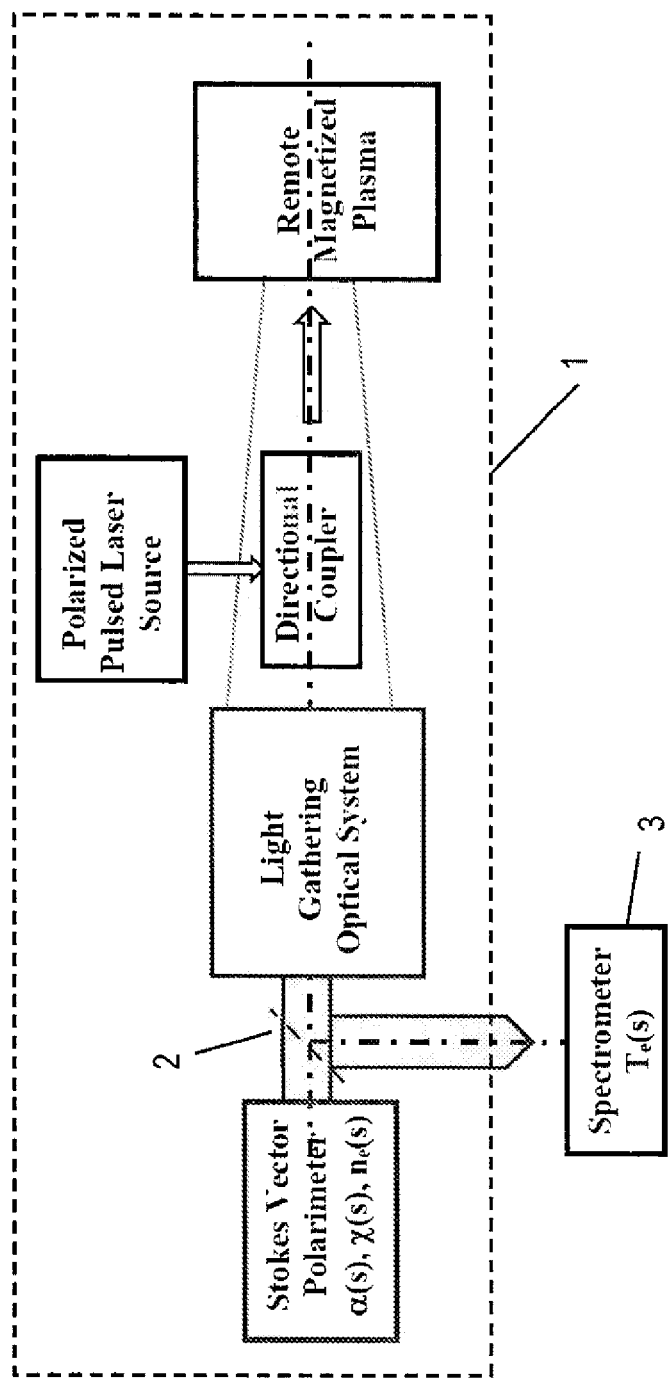
FIG. 1A shows a schematic representation of a pulsed polarimeter.

This disclosure is directed to devices and method for determining, at a distance, the distribution of an inducing magnetic field(s), a density field and a temperature field(s) associated with a magnetized plasma medium. U.S. Pat. No. 7,599,062 B2, has set out the various embodiments of a system for determining, at a distance, the distributions of magnetic field(s) and density field of a magnetized plasma medium. This disclosure generalizes the pulsed polarimeter to include the determination of the electron temperature distribution by adding a wavelength sensitive detection system to the pulsed polarimeter so that the intensity distribution in wavelength can be measured at each point along the trajectory of the pulse.

The method embodiments described below are referred to as pulsed spectropolarimetry and the device embodiments are referred to as a pulsed spectropolarimeter. In the various embodiments described below, a number of structurally similar components comprising the same materials have been identified by the same reference numerals and, in the interest of brevity, and explanation of their structure and function is not repeated.

FIG. 1A shows a schematic representation of a pulsed spectropolarimeter. The pulsed spectropolarimeter contains the prior art pulsed polarimeter as a subsystem, 1, which consists of a pulsed polarized light source, of sufficient pulse intensity to produce a measurable amount of scattering from a magnetized plasma and sufficient brevity of pulse length to resolve the spatial details within the magnetized plasma. The light pulse is redirected using an optical directional coupler to over lay the optic axis of a light collection system that collects backscattered emission from the pulse as the pulse propagates through the plasma medium defining the pulse trajectory, with the parameter s, denoting the distance along the trajectory. The collected emission is analyzed in a polarimeter (ellipsometer) detection system, the most general of which is known as a Stokes vector polarimeter, as this system determines the state of polarization of the emission, quantified by three parameters, two angles, $\alpha(s)$ and $\chi(s)$, and an intensity, $I(s)$. These three quantities can be used to determine 3 physical plasma quantities. The electron density, $n_e(s)$ is derived from $I(s)$ along the trajectory of the pulse. The component of the inducing magnetic field that is parallel to the trajectory, $B_\|(s)$, which by the well-known magneto-optic Faraday effect produces $\alpha(s)$ along the trajectory of the pulse. Recently, in the field of plasma diagnostics, $\chi(s)$, is gaining importance. This angle is related to the component of the magnetic field that is perpendicular to the trajectory of the pulse, $B_\perp(s)$, along the pulse trajectory being produced by the magneto-optic Cotton Mouton effect. These measurements are undertaken using a pulsed polarimeter system as described in the prior art.

As plasmas within the Magnetized Fusion Energy program attain higher and higher thermal energies, the formulas used to interpret the measurements of a pulsed polarimeter begin to accrue errors due to the plasma temperature inside the plasma reaching temperaturespr of 100 million ° K. Relativistic effects begin to affect the dispersion relations of Eqs 2 and 4. The equations are corrected for the local electron temperature along the trajectory of the pulse. Fortunately, the temperature measurements are available if the gathered emission is dispersed in wavelength and the intensity is measured with respect to wavelength with enough resolution to quantify the spectral broadening which is directly related to electron temperature.

FIG. 1A shows a non-polarizing beamsplitter or power splitter, 2, that diverts a known fraction of gathered emission into a spectrometer detection system, 3, which performs the measurement of intensity of light emitted within a number of discrete wavelength bands or channels, $I_{\lambda_i}$, i=1 . . . N.

Figure 2A:
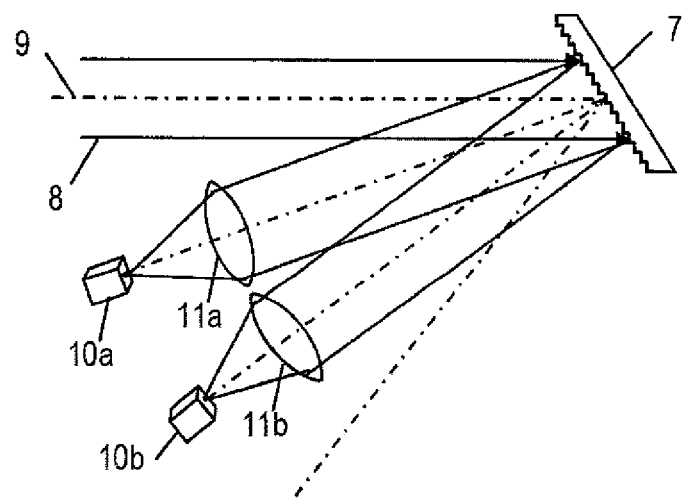
FIG. 2a-c show schematic representations of three different spectrometer systems.
Figure 2B:
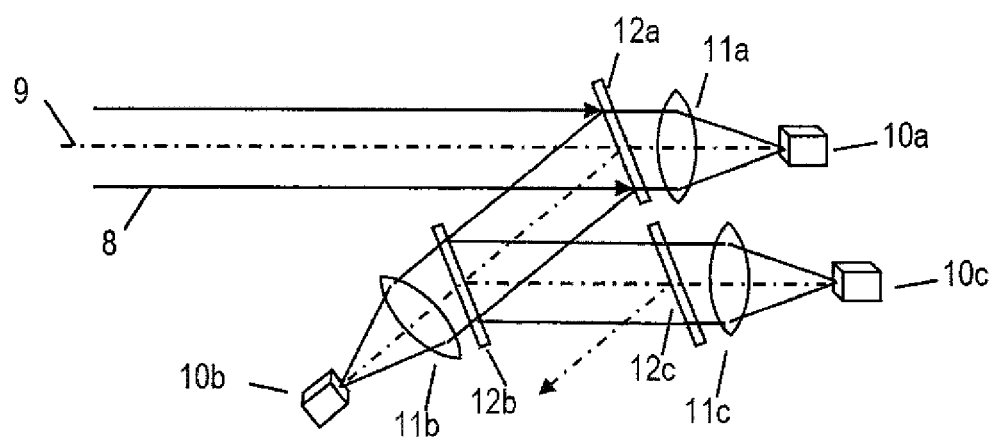
Figure 2C:
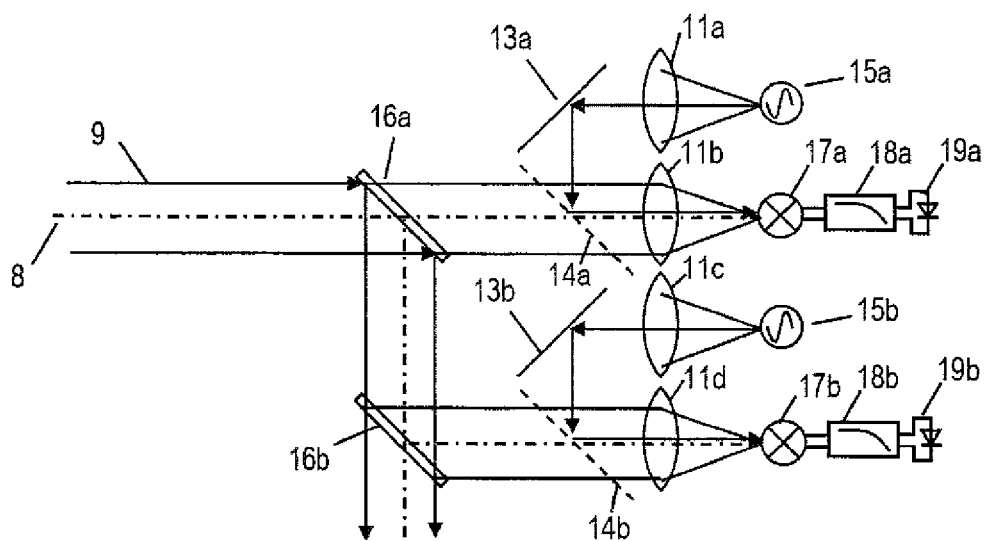

The FIG. 2a-c describe various embodiments of spectrometers which by no means exhaust the possibilities of such a well-developed art. The heart of the spectrometer is the dispersive element that spatially separates the emission into colors or wavelengths that make up the light components of the emission. A prism is an example of a dispersive element, but prisms are rarely used. In FIG. 2a, the spectrometer is based on a diffraction grating dispersive element that separates a collimated beam of light into wavelength channels that are sorted or separated by angle. A collimated beam of light, 8, illuminating the grating, 7, is broken into hundreds of partial waves by the rulings or facets of the grating. These partial waves experience constructive interference for a given wavelength at specific angles of reflection relative to the beam of light, 9. A focusing lens, 11a, is used to gather light at a particular angle or wavelength $\lambda_i$, and a photodiode, 10a, is used to measure intensity, in this band, $I_{\lambda_i}$. This is repeated for N detectors and $I_{\lambda_i}$, i=1, ... N, for the selected angles or wavelengths. Diffraction gratings can also be made to work in transmission, the wavelength channels pass through the transparent grating and exit at various angles to the right of FIG. 2a.

FIG. 2b shows a more modern spectrometer using optical interference filters that define a specific bandpass of wavelengths for each detector. Interference filters usually have high transmission, selectable spectral widths and sharp wavelength cutoffs which are all highly desirable. A collimated beam of light, 8, is partially transmitted and partially reflected by an interference filter, 12a. Interference filters are designed by coating the surfaces of the glass plate with hundreds of reflective coatings of varying thickness and wavelength dependent reflection coefficients to achieve a precise and sharp transmission edge, high transmission over a range of wavelengths and a precise and sharp edge where the transmission stops. What light is not transmitted by the interference filter is reflected onto the next interference filter. The transmitted light is a pass band of wavelengths with a given width, $\Delta\lambda$ about a center wavelength $\lambda_i$ which is focused onto a detector, 10a, by a focusing lens 11a. The reflected light beam is used to repeat this process N−1 more times to yield the intensities, $I_{\lambda_i}$, i 1, ... N at selected wavelength passbands.

The spectrometer in FIG. 2c, is a heterodyne spectrometer that can be used in applications with high resolving power, that is, the spectral width is narrow, too narrow for interference filters, which is the case for the measurement of plasma's ion temperature. The oscillator source, 15a, defines the central wavelength, $\lambda_i$, which is combined with a portion of the collimated light beam 8, using a mirror, 13a, and polarization combining beamsplitter, 14a. The two-light collimated light sources are converted to RF frequencies using an optical mixer, 17a. A bandpass filter, 18a, selects a wavelength transmission band which is detected using an electrical diode detector, 19a, with the detected signal defining the intensity $I_{\lambda_i}$, where $\lambda_i$, is the wavelength of the source 15a. The incoming beam is split by a series of non-polarizing beamsplitters 16a to yield N detected intensities at $\lambda_i$, i=1, ... , N.

The wavelength and the number of wavelength channels can be selected to determine the spectral width of the spectral intensity distribution to cover the range of expected plasma electron temperatures. For example, four to five channels can be used. The detected intensities, $I_{\lambda_i}$, i=1,5 are used to select the best fit from a two parameter family of Gaussian spectral intensity profiles based on peak intensity, yields $n_e(s)$, and spectral width, yields. $T_e(s)$.

Figure 1B:
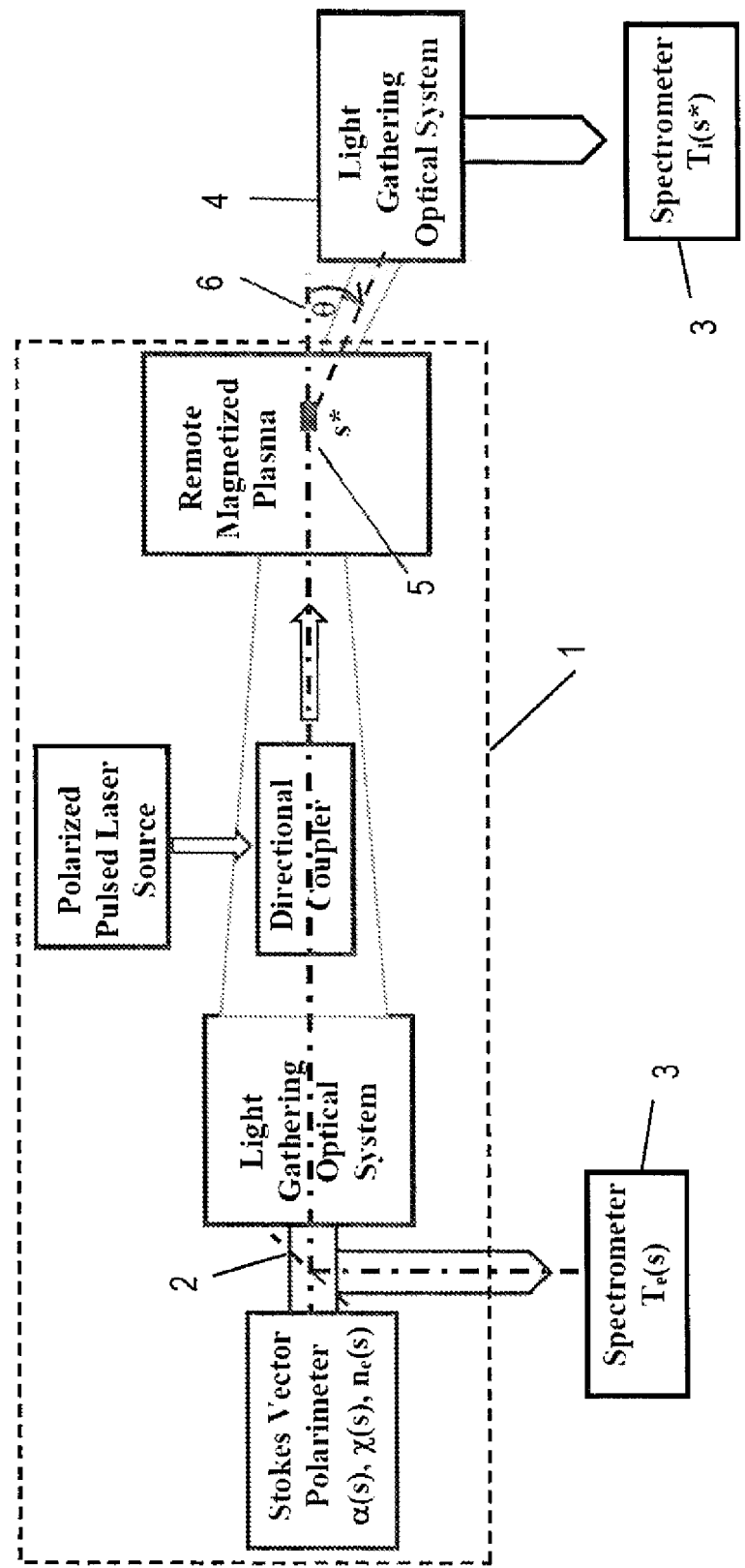
FIG. 1B shows a schematic representation of a pulsed polarimeter.

FIG. 1B shows a schematic representation of a pulsed spectropolarimeter combined with an additional emission gathering collection optic system and spectrometer. Since diagnostic access on a magnetic confinement device is always very limited, an important consideration for any diagnostic system is to consider what measurements can be combined to increase the utility of any given diagnostic. A pulsed spectropolarimeter, the produces Thomson scattering emission that can be used in a separate spectrometer to measure the temperature of the ion species in the plasma at one location, s*, along the trajectory of the pulse. It is possible to align the optic axis of the collection optic so that the pulse is imaged along a portion of the trajectory, 5, as shown in FIG. 1B. The overlap of the propagating pulse and the gathered volume of light by the collection optic defines a cylinder of plasma volume, 5, that will capture emission from the propagating light pulse. The length of this cylinder, $\delta$, is given by the angle, $\theta$, between the pulse trajectory and the collection optics optic axis, $\delta$ as $\delta=w/\sin(\theta)$ where w is the beam waist at the focus of the collection optic. The duration of the Thomson scattering emission into the collection optic is $\tau=\delta/c$ where c is the speed of light. For small $\theta$, this duration can be long. The design and performance of this system depends on the choice of $\theta$.

Note that the scattering angle of 180° (backscatter) is special. Backscatter provides for spatially resolved distributed measurements along the sightline of a pulse in the medium, using the technique known as LIDAR (light Detection And Ranging). Pulsed spectropolarimetry is a combined polarimetry/spectrometry LIDAR technique. But most Thomson scattering diagnostics use scattering angles of 90° and are single point or multi-point systems. FIG. 1B is the combination of a standard Thomson scattering system with a pulsed spectropolarimeter to take advantage of acquiring ion temperature $T_1(s^*)$ measurements at the same time as the distributed measurements of $n_e(s)$, $B_\perp(s)$, $B_\parallel(s)$ and $T_e(s)$ are taken.

THEORY OF EMBODIMENTS

The prior art of pulsed polarimetry has not been implemented on any major plasma devices to date because the appropriate pulsed laser source has yet to be developed. The appropriate wavelength of light to be used with a pulsed polarimeter applied to reactor relevant magnetized plasmas is a pulsed laser source with a wavelength in a terahertz range of about 150-300 μm. This wavelength range provides a robust Faraday rotation along the pulse trajectory. The Faraday rotation over a spatial interval of 10 cm in a plasma with a magnetic field of 1 Tesla and density of $10^{20}$ m$^{-3}$ is 7° for the 150 μm wavelength and 27° for a 300 μm wavelength. Laser wavelengths shorter than 150 μm will have poorer resolution and laser wavelengths longer than 300 μm introduce more CM effects. The desired pulse intensity is around 50 mJ with a pulse duration less than 1 nanosecond. This has been a technological challenge as sources in the terahertz range have been discouragingly weak and the prospects of high pulse energy, ultrashort pulseds suitable for the LIDAR technique are the pulsed Ti-Sapphire ($\lambda_o$=0.8 μm), a pulsed Nd-Yag ($\lambda_o$=1.064 μm) lasers and doubled and tripled frequency versions of these two lasers. Also, $CO_2$ laser ($\lambda_o$=10.6 μm) have been used in LIDAR applications. Recently, multi-mJ THz pulses have been generated using pulsed Ti-Sapphire and Nd-Yag lasers which generate relativistic beams of electrons and they in turn generate the ultra-short, ultra-intense pulse of light in the terahertz range. See *"Multimillijoule terahertz radiation from laser interactions with microplasma waveguides"*, Ke Hu, et al (2021), Plasma Phys. Control. Fusion 63 035028. Conversion efficiencies of 5% are believed possible which means a Ti-Sapphire laser with a 1 J pulse energy will be able to produce the required 50 mJ pulse. Technology has finally caught up to the art of pulsed polarimetry.

Figure 4:
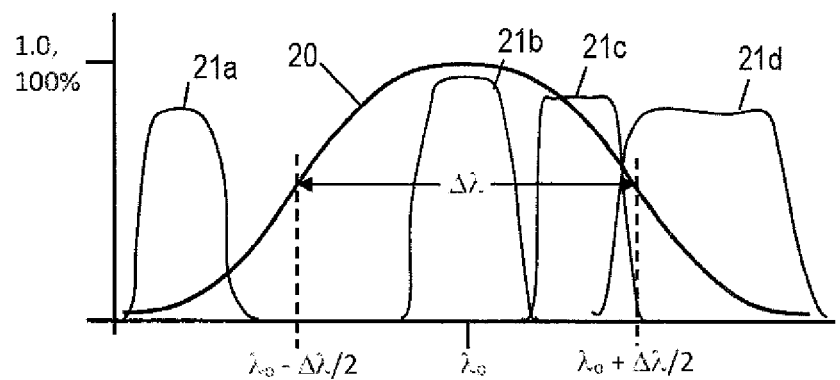
FIG. 4 shows a plot of a normalized Gaussian spectrum of scattered emission versus wavelength and bandpass filters of a spectrometer.

Laser scattering is the LIDAR return signal for a pulsed polarimeter that encodes the plasma's local density and magnetic field in a pulsed polarimeter but laser scattering is also the key plasma diagnostic for measuring the plasma temperature, both electron temperature and ion temperature, which are not necessarily the same. Laser scattering provides a temporal, localized measurement of $T_e$ or $T_i$ from a scattering volume defined by the intersection of the laser beam and the imaged volume of an optical collection system. The pulsed polarimeter can be modified to measure the local electron temperature as well as the state of polarization and intensity of the induced emission. Laser light is scattered only by the electrons, by what is known as Thomson scattering. The spread in wavelength in the scattered emission as shown in FIG. 4 is due to the distribution of velocities of the electrons, which is Maxwellian for a plasma in thermodynamic equilibrium and so is related to the plasma's temperature, $T_e$ at the location of the scattering volume. See e.g., "The LIDAR Thomson scattering diagnostic on JET (invited), H. Salzmann, et al, (1998) *Rev. Sci. Instr.*, 59, 1451. Using a spectrometer detector in combination with the polarimeter detector by dividing or splitting the gathered emission between the two detection systems, $T_e(s)$ can be measured in addition to the magnetic field. Spectropolarimetry is the combination of spectroscopy with polarimetry, using optical sensing to characterize both the polarization and spectral intensity distribution of light originating from a remote light source, in this case, scattered light from a light pulse transiting a magnetized plasma. A pulsed polarimeter with the addition of a spectrometer detector becomes a pulsed spectropolarimeter which can in principle measure $T_e(s)$ along the pulse trajectory in addition to $n_e(s)$, $B_\parallel(s)$ and $B_\perp(s)$. A pulsed spectropolarimeter is a much more complete instrument than a pulsed polarimeter as the formulas, Eqs. 2 and 4, for interpreting $B_\parallel(s)$ and $B_\perp(s)$ from the measured polarimetric angles $\alpha(s)$ and $\chi(s)$ can depend on a local measurement of electron temperature, $T_e(s)$ when the plasma is fusion relevant. The added spectrometer detector provides, $T_e(s)$ which can be used to correct the polarimetric measurements of a pulsed polarimeter at all locations along the trajectory of the pulse. A pulsed spectropolarimeter is a complete, standalone diagnostic that can be applied throughout the Magnetic Fusion Energy program through to engineering fusion reactors.

In order to gain an understanding of the relationship between the scattered emission's spectrum and plasma temperature, consider that electrons impart a change in wavelength for the scattered light by means of a Doppler shift as the moving electrons first absorb the light and then reemit the light in the scattered direction. The shape of the spectral distribution is Gaussian distribution as shown in FIG. 4, with a spectral width $\Delta\lambda$ given by $$\Delta\lambda = 8\sin(\theta/2)\lambda_0/c\sqrt{0.693 \cdot \frac{2k_B T_e}{m_e}} \qquad \text{Eq 7}$$

For a 150 µm laser wavelength, the spectral width, $\Delta\lambda$, is 197 µm for LIDAR backscatter. $\theta=180°$, and $T_e=100$ million ° K, $k_B$ is the Boltzmann's constant $1.38\times10^{-23}$ J/° K. The half width $\Delta\lambda/2$ is 98 µm, a substantial fraction of the laser wavelength. The spectral profile in wavelength, of the gathered emission is measured using a spectrometer detector that disperses the emission in wavelength and measures the power or intensity in discrete wavelength windows centered at specific, N, wavelengths, $I_{\lambda_1}, I_{\lambda_2}, \ldots, I_{\lambda_N}$. A realization of a spectrometer for such a wide spectral distribution makes the use of passband interference filters and photodiode detection of the filtered light. The spectrometer shown in FIG. 2*b* using a set of passband transmission filters as shown in FIG. 4 to provide four integrated measurements of the scattered emission at specific wavelengths the spectral width, $\Delta\lambda$, of the Gaussian profile can be accurately determined which is related to the electron temperature. The number of filters and filter central wavelengths are chosen so that the spectrometer accurately measures a range of temperatures from 1 million to 100 million ° K as the plasma temperature rises.

The total collected scattering energy, $E_{sc}$, for a scattering length ds is given by $$E_{sc}(s) = E_{pulse} n_e(s) r_e^2 \Delta\Omega \cdot ds \qquad \text{Eq 8}$$

where $r_e$ is the classical electron radius, $2.82\times10^{-15}$ m, taking $\Delta\Omega$, the collection solid angle, as 0.05 steradian (sr), and ds is the length of the scattered volume, as 0.1 m and the plasma density, $n_e(s)$ at the scattering location s along the pulse trajectory is $10^{20}$ m$^{-3}$. For a pulse energy of 50 mJ, total collected scattered energy is 0.2 picoJ.

For LIDAR it is more appropriate to work with intensities as the pulse is moving through the plasma. The collected scattered intensity is $$I_{sc}(s) = \frac{c}{2} \cdot E_{pulse} n_e(s) r_e^2 \Delta\Omega \qquad \text{Eq 9}$$

The scattered intensity is about 30 µWatts The parameter that can be measured in a plasma of fusion relevance is the ion temperature. The electron temperature, $T_e$, is a poor indicator of the plasma's fusion performance. The electron temperature is a parameter that modifies the optical dispersion formulas used in polarimetry, Eqs. 1 and 2, if $T_e$ is approaching 100 million ° K, but the ion temperature, $T_i$, of the deuterium and tritium ions govern the rate of fusion production. The ion temperature, $T_i$, can also be measured using Thomson scattering but the scattering angle is substantially smaller than that of backscatter, 180°, used in the pulsed polarimeter technique. A scattering detection system is usually used with a small scattering angle in the forward direction. Since the pulse in a pulsed polarimeter diagnostic is propagating through the plasma, there is an opportunity to measure the ion temperature anywhere along the pulse's trajectory by installing a light collection system that gathers and collimates light scattered from that location in the pulse, where the optic axis and the pulse trajectory coincide, s*. The emission will come from a finite length of the pulse trajectory centered at s* given by waist of the focus of the light gathering system and the scattering angle. The light gathering system can be identical to those light gathering systems used in a pulsed polarimeter together with a spectrometer detector to determine the spread of intensities in wavelength for the forward directed Thomson scattering. The temperature of the ions can be determined at that location, s*, and at that brief time when the pulse is in the field of view of the optical system. For backscatter, the Thomson scattering is called incoherent Thomson scattering and the spectral width directly corresponds to the electron temperature, $T_e$, for forward scattering, the Thomson scattering is called collective Thomson scattering and the spectral width directly corresponds to the ion temperature, $T_i$. The nature of the scattering is governed by the scattering parameter. $\alpha_{sc}$ given by $$\alpha_{sc} = \frac{\lambda_0/\lambda_{Debye}}{4\pi\sin\left(\frac{\theta}{2}\right)} \qquad \text{Eq 5}$$

where $\lambda_o$ is the wavelength of the laser light, taken as 150 microns, $\theta$ is the scattering angle, which for backscatter is 180° and $\lambda_{Debye}$ is a fundamental length scale. The Debye length has a weak electron temperature, $T_e$ and density, $n_e$ dependence and is given by $$\lambda_{Debye} = 69 \text{ microns } x \sqrt{\frac{T_e}{n_e}} \quad \text{Eq 6}$$

where $T_e$ is in units of °K and density in units of $m^{-3}$.

Thomson scattering is incoherent if $\alpha_{sc}<1$ and the electron temperature is encoded in the scattering. Thomson scattering is collective if $\alpha_{sc}>1$ and the ion temperature is encoded in the scattering; this can always be arranged by making $\theta$ small, as $\alpha_{sc}\sim 1/\theta$ for small angles or forward directed scattering. For a pulsed polarimeter, the Thomson scattering is backscatter ($\theta=180$) which represents the smallest possible $\alpha_{sc}$ and is invariably <1. One can also choose the laser wavelength, $\lambda_o$, to adjust the nature of the scattering at any given angle, $\theta$, but a value for $\lambda_o$ is usually chosen to make a robust Faraday rotation.

For the forward scattered emission, one might chose an angle, $\theta$, of 5°. The scattering parameter, $\alpha_{sc}$ is 3.7 by Eqs 5 and 6 for a wavelength of 150 µm and a temperature of 100 million °K and a density of $10^{20}$ $m^{-3}$. The Thomson scattering is in the collective regime since $\alpha_{sc}>1$.

In this case the laser sees the electrons as tied to or dressing the ions. One analogy is that the electrons are like flies on a herd of cows. The scattering then follows, not the distribution of electron velocities but the distribution of ion velocities, although the scattering is still due to the electron charges.

Since the velocity of the ions is slower in relation to the electrons by the square root of the ratio of their masses. $\sqrt{(m_i/m_e)}$ which is around 40, the scattering width, $\Delta\lambda$ is scaled down by 40 and the spectral width is only 5 µm. In addition, the spectral width is proportional to $\sin(\theta/2)$ from Eq 7, so that the spectral width is decreased by the ratio $\sin(5°/2)/\sin(180°/2)$ or 0.04 which reduces $\Delta\lambda$ to 0.22 µm. The ion spectral width is very narrow. In frequency, the central wavelength is 150 µm or 2 THz so the spectral width is only 3 GHz or 1.5 GHz half width. This is why a heterodyne spectrometer of FIG. 2c is used for the ion temperature spectrometer. A comb of wavelengths within a narrow range of 150 µm is used as local oscillators to make an RF signal that is filtered to a bandwidth of several 100 MHz and the power in that filtered emission is detected providing a measurement for the spectral curve of the ion scattered emission.

For a pulse moving at the speed of light, the signal is brief. For the collection optic's axis intersecting the pulse trajectory at 5°, the length of the trajectory that is imaged is w/sin(5°) where w, is the width of the diameter of the waist at the focus of the collection optics. Taking w to be 10 cm, the emission is collected over 1 meter of the pulse trajectory or 3 nanosecond (ns) duration. The 1-meter distance is appropriate for large scale fusion devices. The brevity of the light pulse, 3 ns, is on the order of the bandwidths of the individual filtering channels so the resolution will be poor but it will provide some information on the ion temperature.

Figure 3:
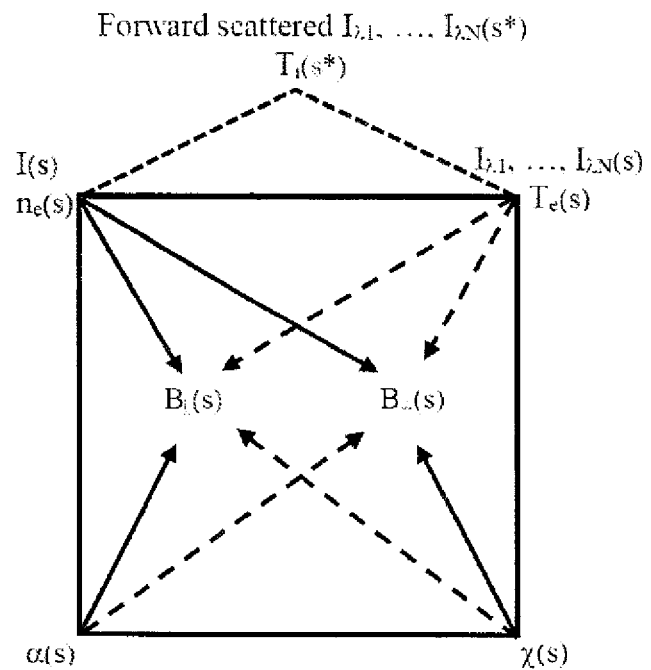
FIG. 3 shows the interconnectedness of the measurements of a pulsed spectropolarimeter and dependencies of measurements for deriving physical parameters of interest in a magnetized plasma medium reaching thermonuclear conditions.

An overview of the interconnectedness of the measurements that achieves the physical parameters. $B_\parallel(s)$ and $B_\perp(s)$, is shown in FIG. 3. In the graph of FIG. 3, a pulsed polarimeter provides the 3 measured quantities. I(s), $\alpha(s)$, $\chi(s)$ along the light pulse's trajectory. The plasma's electron density, $n_e(s)$, is directly proportional to the measured I(s). The polarimetry measurements of $\alpha(s)$ and $\chi(s)$ together with $n_e(s)$ result in the medium's physical magnetic field components $B_\parallel(s)$ and $B_\perp(s)$, respectively, but have a weak interdependence that can be corrected if both are measured as distributed quantities along the trajectory. Direct dependencies are shown as solid lines and indirect or weaker dependencies are shown as dotted lines. The measurement of $T_o$ at a specific point s* is optional measurement but can be accommodated for any diagnostic that is emitting Thomson scattering, as the scattering is in all directions, backward, forward and to the side. There is a synergy and completeness to the pulsed polarimeter if the measurement of $T_e(s)$ could be added as shown in FIG. 3 with the use of spectrometer detector. The correction due to high electron temperature, can usually be ignored in laboratory plasmas but can be taken into account using other diagnostics applied to the plasma, but if the measurement of $T_e(s)$ could be incorporated into the pulsed polarimeter system then the resulting pulsed spectropolarimeter becomes a standalone diagnostic that applies throughout the Magnetic Fusion Energy program through to reactor relevant plasmas.

As the fusion devices approach reactor relevance where the plasma achieves the parameters of density and ion temperature to sustain a fusion reaction and produce energy, many of the present diagnostics will not be able to cope with the plasma environment. Pulsed polarimetry is one of the so-called advanced diagnostics that can be sited on a reactor as a remote sensing technique. Pulsed polarimetry will require a collection optic (mirror) behind the first wall but because the wavelength range is in the terahertz region of the optical spectrum, the mirror will be robust to the hostile environment of the burning plasma and the diagnostic will be unaffected, whereas diagnostics using light in the visible wavelength range will be compromised by the changes to the surface quality due to the plasma Also, the LIDAR technique uses only one port for the injection of the light pulse and the collection of the emission, so it is economical with space. Adding a temperature measurement to the pulsed polarimeter considerably increases the utility of the diagnostic for fusion reactors. The ion temperature. $T_i(s)$ is accessible using pulsed spectropolarimetry if the laser wavelength, $\lambda_o$, is long enough to make the scattering parameter, $\alpha_{sc}$ greater than 1, as given by Eq 5. In this case, the wavelength would be in the microwave region, with $\lambda_o>1$ cm. This is certainly possible if an appropriate microwave pulsed laser system is available. There would be considerable refraction at these wavelengths which would make the pulse trajectory curve in the plasma, but a pulsed spectropolarimeter is immune to refraction of the light pulse as the backscatter would follow the curved return path to the detector. A more practical way to obtain the plasma's ion temperature is to add a second light collection receiver aimed at the trajectory at a location s* and gather emission in a forward scattering direction that makes $\alpha_{sc}$ greater than 1, then all parameters $T_e(s)$, $n_e(s)$, $B_\parallel(s)$, $B_\perp(s)$ and $T_i(s*)$ become measurable using one pulsed laser system.

Diagnostics that are in trouble of not performing well in burning plasmas are all diagnostics that use light in the visible region of the spectrum, that use components mounted in the wall of the reactor, for instance, electrical pickup coils for magnetic sensing or retroreflectors for laser polarimetry systems and those diagnostics that use emission from impurity species that are introduced to the plasma in beams of particles. This disallows many of the conventional diagnostics systems that provide magnetic field information such as the Motional Stark effect diagnostic laser polarimetry and electrical magnetic probes.

In order to control and optimize a burning plasma, real time and distributed measurements of the density, plasma temperature and magnetic field are desired. Pulsed polarimetry provides that if temperature capability is added which makes the diagnostic into a pulsed spectropolarimeter as set out in this patent.

It is appreciated that the previous description of the disclosed embodiments is provided to enable any person skilled in the art to make or use the present disclosure. Various modifications to these embodiments will be apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The invention claimed is:

1. A method for measuring an internal magnetic field at extremely high temperatures comprising,
producing a polarized pulse of light from a laser source,
directing the pulse along an optic axis of collection optics with a directional coupler,
directing the pulse into a plasma,
gathering a solid angle of backscattered light emission caused by interaction of the pulse with the plasma,
splitting off a fractional part of the light emission with a non-polarizing beam splitter,
receiving the fractional part of the light emission in a spectrometer,
determining a spatially resolved spectral power distributions of the light emission in wavelength along the pulse's sightline in the medium,
measuring an intensity distribution in wavelength at each point along a trajectory of the pulse,
fitting the intensity distribution to a Gaussian profile, and
measuring the spectral width to determine electron temperature, and
providing a second light gathering optical system and spectrometer with a second optic axis directed to a predetermined point along the path of the pulse in the plasma, wherein a predetermined angle to the path is not 0 and 180 degrees.

2. The method of claim 1 further comprising,
correcting the measured plasma magnetic field with the electron temperature.

3. The method of claim 1 wherein,
the laser source has a wavelength less than 300 µm.

4. The method of claim 1 further comprising,
measuring an intensity distribution in wavelength at each point along a trajectory of the pulse using a heterodyne spectrometer,
fitting the intensity distribution to a Gaussian profile, and
measuring the spectral width to determine ion temperature.

5. The method claim 4 wherein,
the laser source has a wavelength of 100-3000 µm.

* * * * *